US007701008B2

(12) United States Patent
Yeo et al.

(10) Patent No.: US 7,701,008 B2
(45) Date of Patent: Apr. 20, 2010

(54) DOPING OF SEMICONDUCTOR FIN DEVICES

(75) Inventors: Yee-Chia Yeo, Hsin-Chu (TW); Ping-Wei Wang, Hsin-Chu (TW); Hao-Yu Chen, Kaohsiung (TW); Fu-Liang Yang, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 376 days.

(21) Appl. No.: 11/446,890

(22) Filed: Jun. 5, 2006

(65) Prior Publication Data

US 2006/0220133 A1 Oct. 5, 2006

Related U.S. Application Data

(62) Division of application No. 10/425,156, filed on Apr. 29, 2003, now Pat. No. 7,074,656.

(51) Int. Cl.
*H01L 29/76* (2006.01)

(52) U.S. Cl. ....................... 257/347; 257/345; 257/335; 257/E29.117

(58) Field of Classification Search ................. 257/347, 257/345, 335, E29.117
See application file for complete search history.

(56) References Cited

U.S. PATENT DOCUMENTS

| | | | |
|---|---|---|---|
| 4,933,298 | A | 6/1990 | Hasegawa |
| 4,946,799 | A | 8/1990 | Blake et al. |
| 5,115,289 | A | 5/1992 | Hisamoto et al. |
| 5,317,175 | A | 5/1994 | Throngnumchai |
| 5,317,178 | A | 5/1994 | Wu |
| 5,464,783 | A | 11/1995 | Kim et al. |
| 5,607,865 | A | 3/1997 | Choi et al. |
| 5,801,397 | A | 9/1998 | Cunningham |
| 5,814,895 | A | 9/1998 | Hirayama |
| 5,998,852 | A | 12/1999 | Berry et al. |

(Continued)

FOREIGN PATENT DOCUMENTS

| | | |
|---|---|---|
| FR | 2 617 642 | 1/1969 |

(Continued)

OTHER PUBLICATIONS

Solymar, L., et al., "Electrical Properties of Materials," Oxford University Press, 1998, Sixth Edition, pp. 152.

(Continued)

*Primary Examiner*—Eugene Lee
(74) *Attorney, Agent, or Firm*—Slater & Matsil, L.L.P.

(57) ABSTRACT

A semiconductor structure includes of a plurality of semiconductor fins overlying an insulator layer, a gate dielectric overlying a portion of said semiconductor fin, and a gate electrode overlying the gate dielectric. Each of the semiconductor fins has a top surface, a first sidewall surface, and a second sidewall surface. Dopant ions are implanted at a first angle (e.g., greater than about 7°) with respect to the normal of the top surface of the semiconductor fin to dope the first sidewall surface and the top surface. Further dopant ions are implanted with respect to the normal of the top surface of the semiconductor fin to dope the second sidewall surface and the top surface.

19 Claims, 9 Drawing Sheets

U.S. PATENT DOCUMENTS 6,114,725 A 9/2000 Furukawa et al.
6,157,061 A 12/2000 Kawata
6,222,234 B1 4/2001 Imai
6,252,284 B1 6/2001 Muller et al.
6,300,182 B1 10/2001 Yu
6,342,410 B1 1/2002 Yu
6,344,392 B1 2/2002 Liaw
6,380,024 B1 4/2002 Liaw
6,387,739 B1 5/2002 Smith, III
6,391,695 B1 5/2002 Yu
6,391,782 B1 5/2002 Yu
6,391,796 B1 5/2002 Akiyama et al.
6,411,725 B1 6/2002 Rhoads
6,413,802 B1 7/2002 Hu et al.
6,432,829 B2 8/2002 Muller et al.
6,451,656 B1 9/2002 Yu et al.
6,475,869 B1 * 11/2002 Yu ............................ 438/303
6,475,890 B1 11/2002 Yu
6,476,437 B2 11/2002 Liaw
6,492,212 B1 12/2002 Ieong et al.
6,514,808 B1 2/2003 Samavedam et al.
6,521,949 B2 2/2003 Assaderaghi et al.
6,525,403 B2 2/2003 Inaba et al.
6,534,807 B2 3/2003 Mandelman et al.
6,562,491 B1 5/2003 Jeon
6,573,549 B1 6/2003 Deng et al.
6,596,599 B1 7/2003 Guo
6,605,514 B1 8/2003 Tabery et al.
6,610,576 B2 8/2003 Nowak
6,611,029 B1 8/2003 Ahmed et al.
6,617,210 B1 9/2003 Chau et al.
6,635,909 B2 10/2003 Clark et al.
6,642,090 B1 11/2003 Fried et al.
6,657,252 B2 12/2003 Fried et al.
6,686,231 B1 2/2004 Ahmed et al.
6,706,571 B1 3/2004 Yu et al.
6,720,231 B2 4/2004 Fried et al.
6,720,619 B1 4/2004 Chen et al.
6,762,448 B1 7/2004 Lin et al.
6,768,158 B2 7/2004 Lee et al.
6,787,854 B1 * 9/2004 Yang et al. .................. 257/348
6,821,834 B2 11/2004 Ando
6,833,588 B2 12/2004 Yu et al.
6,844,238 B2 1/2005 Yeo et al.
6,855,606 B2 2/2005 Chen et al.
6,855,990 B2 2/2005 Yeo et al.
6,858,478 B2 * 2/2005 Chau et al. .................. 438/149
6,864,519 B2 3/2005 Yeo et al.
6,885,055 B2 * 4/2005 Lee ........................... 257/308
6,992,354 B2 1/2006 Nowak et al.
7,005,330 B2 2/2006 Yeo et al.
7,105,894 B2 9/2006 Yeo et al.
7,148,526 B1 * 12/2006 An et al. ..................... 257/288
7,214,991 B2 5/2007 Yeo et al.
7,265,417 B2 * 9/2007 Adkisson et al. ............ 257/347
7,276,763 B2 10/2007 Yeo et al.
7,358,121 B2 * 4/2008 Chau et al. .................. 438/149
2002/0011612 A1 1/2002 Hieda
2003/0011080 A1 1/2003 Deshpande et al.
2003/0042528 A1 3/2003 Forbes
2003/0042531 A1 3/2003 Lee et al.
2003/0057486 A1 3/2003 Gambino et al.
2003/0067017 A1 4/2003 Ieong et al.
2003/0102497 A1 6/2003 Fried et al.
2003/0111678 A1 6/2003 Colombo et al.
2003/0113970 A1 6/2003 Fried et al.
2003/0178670 A1 9/2003 Fried et al.
2003/0178677 A1 9/2003 Clark et al.
2004/0007715 A1 1/2004 Webb et al.
2004/0031979 A1 2/2004 Lochtefeld et al.
2004/0036126 A1 2/2004 Chau et al.
2004/0038464 A1 2/2004 Fried et al.
2004/0061178 A1 4/2004 Lin et al.
2004/0075122 A1 4/2004 Lin et al.
2004/0087094 A1 5/2004 Wristers et al.
2004/0108523 A1 6/2004 Chen et al.
2004/0119100 A1 * 6/2004 Nowak et al. ............... 257/204
2004/0145000 A1 7/2004 An et al.
2005/0121706 A1 6/2005 Chen et al.
2005/0275010 A1 12/2005 Chen et al.
2006/0234431 A1 10/2006 Yeo et al.

FOREIGN PATENT DOCUMENTS

JP 02-015875 1/1990

OTHER PUBLICATIONS

Wolf, S., "Silicon Processing for the VLSI Era"; vol. 2-Chapter 6, CMOS Process Integration, p. 369, Lattice Press, Sunset Beach, CA.
Yang, et al, "25nm CMOS Omega FETs," International Electron Devices Meeting, Digest of Technical Papers, 2002, pp. 255-258, IEEE.
Chau, R., et al., "Advanced Depleted-Substrate Transistors: Single-gate, Double-gate and trl-gate," Extended Abstracts of the 2002 International Conference on Solid State Devices and Materials (2002) pp. 68-69.
Colinge, J.P., et al., Silicon-on-Insulator "Gate—All-Around Device," International Electron Devices Meeting (Apr. 1990) pp. 595-598.
Huang, X., et al., "Sub-50 nm P-Channel FinFET," IEEE Transactions on Electron Devices, vol. 48, No. 5 (May 2001) pp. 880-886.
Leobandung, E., et al., "Wire-Channel and Wrap-Around-Gate Metal Oxide-Semiconductor Field-Effect Transistors with a Significant Reduction of Short Channel Effects," Journal of Vacuum Science and Technology B, vol. 15, No. 6 (Nov. 1997) pp. 2791-2794.
Wong, H.S.P., "Beyond the Conventional Transistor," IBM Journal of Research and Development, vol. 46, No. 2/3 (Mar./May 2002) pp. 133-167.
Yang, et al., "23nm CMOS Omega FETs," International Electron Devices Meeting, Digest of Technical Papers (Dec. 2002) pp. 109-110.
Yang, et al., "35nm CMOS FinFETs," 2002 Symposium on VLSI Technology Digest of Technical Papers (Jun. 2002) pp. 109-110. cited by other.
Auth, Christopher P., et al., "Scaling Theory for Cylindrical, Fully-Depleted, Surrounding-Gate MOSFETs," IEEE Electron Device Letters, vol. 18, No. 2 (Feb. 1997) pp. 74-76.
Celik, Muhsin, et al., "A 45nm Gate Length High Performance SOI Transistor for 100nm CMOS Technology Applications," Symposium on VLSI Technology Digest of Technical Papers (2002) pp. 166-167.
Chau, Robert, et al., "A 50nm Depleted-Substrate CMOS Transistor (DST)," IEDM (2001) pp. 621-624.
Chen, W., et al., "Suppression of the SOI Floating-body Effects by Linked-body Device Structure," Symposium on VLSI Technology Digest of Technical Papers (1996) pp. 92-93.
Fung, Samuel K.H., et al., "Gate Length Scaling Accelerated to 30nm regime using Ultra-thin Film PD-SOI Technology," IEDM (2001) pp. 629-632.
Geppert, Linda, "The Amazing Vanishing Transistor Act," IEEE Spectrum (Oct. 2002) pp. 28-33.
Kranti, Abhinav, et al., "Design Guidelines of Vertical Surrounding Gate (VSG) MOSFETs for Future ULSI Circuit Applications," IEEE (2001) pp. 161-165.
Je, Minkyu, et al., "Quantized Conductance of a Gate-all-Around Silicon Quantum Wire Transistor," Microprocesses and Nanotechnology Conference (1998) pp. 150-151.
Nemati, Farid, et al., "A Novel Thyristor-based SRAM Cell (T-RAM) for High-Speed, Low-Voltage, Giga-scale Memories," IEDM (1999) pp. 283-286.
Nitayama. Akihiro, et al., "Multi-Pillar Surrounding Gate Transistor (M-SGT) for Compact and High-Speed Circuits," IEEE Transactions on Electron Devices, vol. 38, No. 3 (Mar. 1991) pp. 579-583.

Oh, Sang-Hyun, et al., "Analytic Description of Short-Channel Effects in Fully-Depleted Double-Gate and Cylindrical, Surrounding-Gate MOSFETs," IEEE Electron Device Letters, vol. 21, No. 9 (Sep. 2000) pp. 445-447.
Sato, Nobuhiko, et al., "Hydrogen Annealed Silicon-On-Insulator," Appl. Physics Letter, vol. 65, No. 15 (Oct. 10, 1994) pp. 1924-1926.
Shahidi, G.G., "SOI Technology for the GHz Era," IBM J. Res. & Dev., vol. 46, No. 2/3 (Mar./May 2002) pp. 121-131.
Tang, Stephen H., et al., "FinFET—A Quasi-Planar Double-Gate MOSFET," IEEE International Solid-State Circuits Conference (2001) pp. 118-119 & 437.
Yamagata, K., et al., "Selective Growth of Si Crystals from the Agglomerated Si Seeds Over Amorphous Substrates," Appl. Phys, Lett., vol. 61, No. 21 (Nov. 23, 1992) pp, 2557-2559.

* cited by examiner

DOPING OF SEMICONDUCTOR FIN DEVICES

This application is a divisional of patent application Ser. No. 10/425,156, entitled “Doping of Semiconductor Fin Devices,” filed on Apr. 29, 2003, now U.S. Pat. No. 7,074,656 which application is incorporated herein by reference.

TECHNICAL FIELD

The present invention relates to semiconductor devices and more particularly to semiconductor devices with fin structures and methods for doping semiconductor fin devices.

BACKGROUND

The dominant semiconductor technology used for the manufacture of ultra-large scale integrated (ULSI) circuits is the metal-oxide-semiconductor field effect transistor (MOSFET) technology. Reduction in the size of MOSFETs has provided continued improvement in speed performance, circuit density, and cost per unit function over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel.

Phenomena such as reduced gate control associated with transistors with short channel lengths are termed short-channel effects. Increased body doping concentration, reduced gate oxide thickness, and ultra-shallow source/drain junctions are ways to suppress short-channel effects. However, for device scaling well into the sub-50 nm regime, the requirements for body-doping concentration, gate oxide thickness, and source/drain (S/D) doping profiles become increasingly difficult to meet when conventional device structures based on bulk silicon (Si) substrates are employed. Innovations in front-end process technologies or the introduction of alternative device structures may be needed to sustain the historical pace of device scaling.

For device scaling well into the sub-30-nm regime, a promising approach to controlling short-channel effects is to use an alternative transistor structure with more than one gate, i.e., multiple-gates. An example of the alternative transistor structure is the multiple-gate transistor. Examples of the multiple-gate transistor include the double-gate transistor, triple-gate transistor, omega field-effect transistor (FET), and the surround-gate or wrap-around gate transistor. A multiple-gate transistor structure is expected to extend the scalability of CMOS technology beyond the limitations of the conventional bulk MOSFET and realize the ultimate limit of silicon MOSFETs. The introduction of additional gates improves the capacitance coupling between the gates and the channel, increases the control of the channel potential by the gate, helps suppress short channel effects, and prolongs the scalability of the MOS transistor.

The simplest example of a multiple-gate transistor is the double-gate transistor, as described in U.S. Pat. No. 6,413,802 (’802) issued to Hu, et al. and incorporated herein by reference. In the ’802 patent, the transistor channel comprises a thin silicon fin defined using an etchant mask and formed on an insulator layer, e.g., silicon oxide. Gate oxidation is performed, followed by gate deposition and gate patterning to form a double-gate structure overlying the sides of the fin. Both the source-to-drain direction and the gate-to-gate direction are in the plane of the substrate surface.

SUMMARY OF THE INVENTION

The preferred embodiment of the present invention provides several methods for doping the semiconductor fin in a multiple-gate transistor to provide improved performance. In embodiments of the invention, the channel length is more uniformly doped than in certain prior art implementation thereby improving performance.

A first embodiment provides a method of doping semiconductor fins of multiple-gate transistors. A semiconductor structure includes of a plurality of semiconductor fins overlying an insulator layer, a gate dielectric overlying a portion of said semiconductor fin, and a gate electrode overlying the gate dielectric. Each of the semiconductor fins has a top surface, a first sidewall surface, and a second sidewall surface. Dopant ions are implanted at a first angle (greater than 7") with respect to the normal of the top surface of the semiconductor fin to dope the first sidewall surface and the top surface. Further dopant ions are implanted with respect to the normal of the top surface of the semiconductor fin to dope the second sidewall surface and the top surface.

A second embodiment provides a method to dope semiconductor fins with a different orientation. In this embodiment, a first mask covers the second semiconductor fin while the first semiconductor fin is doped by implanting dopant ions with a large implant angle. Similarly, a second mask covers the first semiconductor fin while the second semiconductor fin is doped by implanting the dopant ions with a large implant angle.

The present invention also includes structure embodiments. For example, semiconductor-on-insulator chip includes a plurality of multiple-gate transistors formed on an insulator layer. Each multiple-gate transistor includes a semiconductor fin having an orientation a gate electrode having a gate length of less than 30 nm. The orientation of each transistor of the plurality of multiple-gate transistors is the same. Other methods and structures are also taught.

A semiconductor-on-insulator chip comprising of a plurality of multiple-gate transistors formed on an insulator layer, each multiple-gate transistor comprising of a semiconductor fin having an orientation and a gate electrode having a gate length equal to the minimum feature size, said orientations of the plurality of multiple-gate transistors being the same.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The preferred embodiment of the present invention relates to the field of semiconductor devices and more particularly to semiconductor devices with a fin structure. The present invention provides several methods for doping the semiconductor fin in a multiple-gate transistor.

Figure 1A:
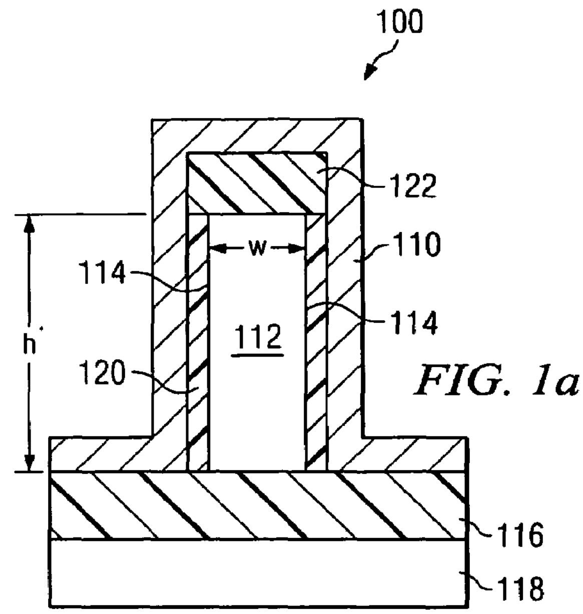
FIG. 1*a* illustrates a double gate device structure.
Figure 1B:
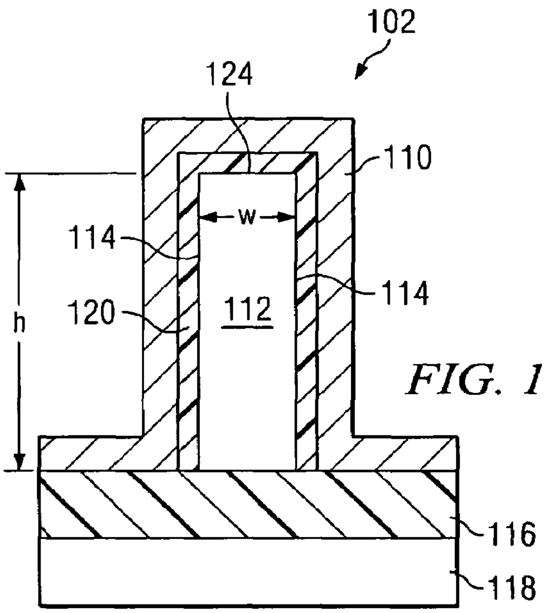
FIG. 1*b* illustrates a triple-gate device structure.
Figure 2:
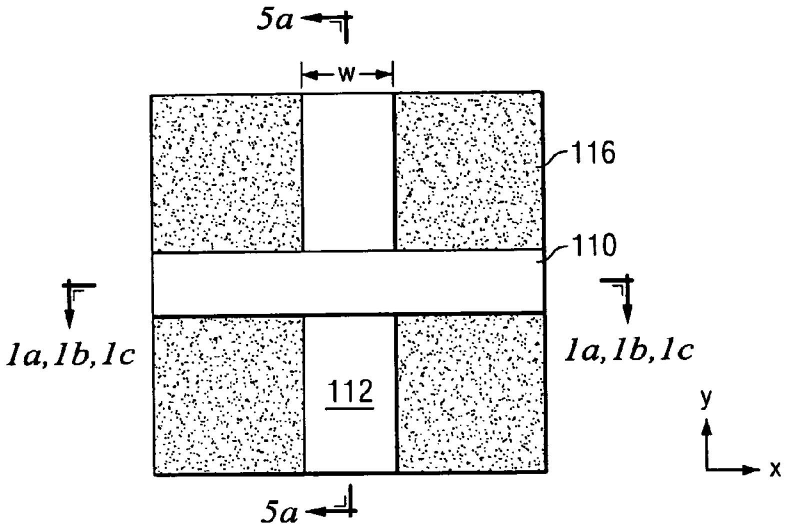
FIG. 2 is a plan view of a multiple gate transistor.
Figure 3A:
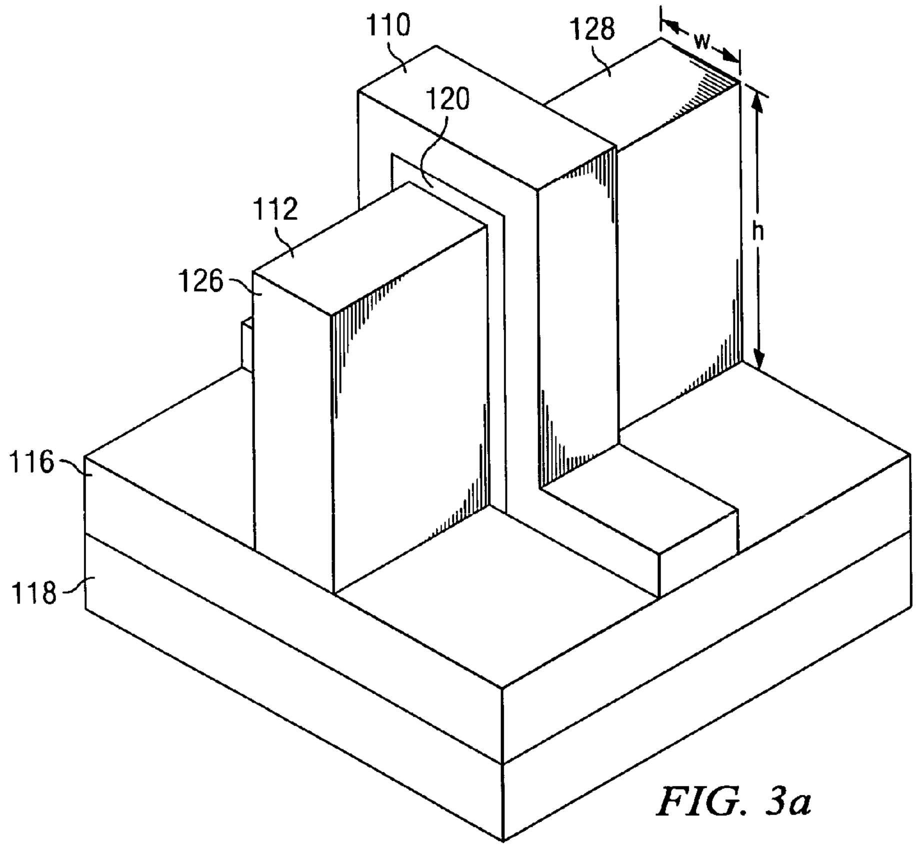
FIG. 3*a* illustrates a three-dimensional perspective of a triple-gate transistor.

Another example of the multiple-gate transistor is the triple-gate transistor 102. The cross-section of the triple-gate transistor structure 102 is illustrated in FIG. 1*b*. The plan view of the triple-gate structure is the same as the double-gate structure and is shown in FIG. 2. The triple-gate transistor structure has a gate electrode 110 that forms three gates: one gate on the top surface 124 of the silicon body/fin 112, and two gates on the sidewalls 114 of the silicon body/fin 112. The triple-gate transistor achieves better gate control than the double-gate transistor because it has one more gate on the top of the silicon fin. A three-dimensional view of the triple-gate transistor 102 is shown in FIG. 3*a*. FIG. 3*a* illustrates source region 126 and drain region 128, which are formed in silicon body 112 on opposite sides of the channel region. An example of a triple-gate transistor is provided by R. Chau, et al., "Advanced depleted-substrate transistors: single-gate, double-gate, and tri-gate," 2002 International Conference on Solid State Devices and Materials, Nagoya, Japan, pp. 68-69, September 2002, which is incorporated herein by reference.

Figure 1C:
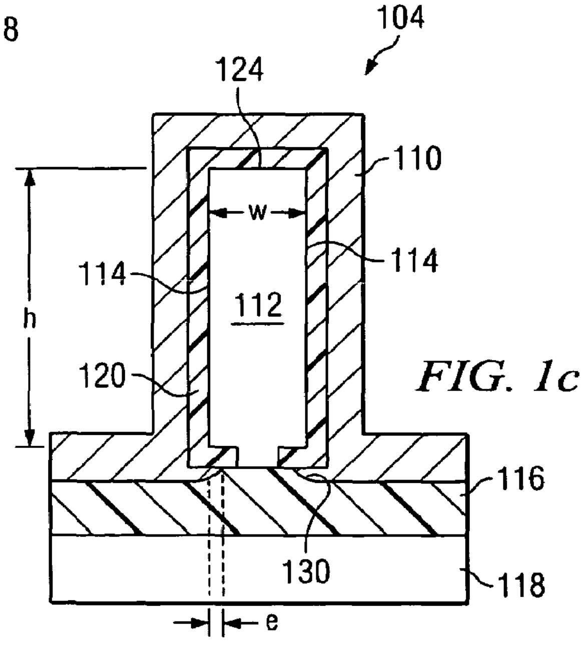
FIG. 1*c* illustrates an omega field-effect transistor.

The triple-gate transistor structure may be modified for improved gate control, as illustrated in FIG. 1*c*. Such a structure 104 is also known as the Omega (W) field-effect transistor (FET), or simply omega-FET, since the gate electrode 110 has an omega-shape in its cross-sectional view. The encroachment of the gate electrode 110 under the semiconductor fin body 112 forms an omega-shaped gate structure. It closely resembles the Gate-All-Around (GAA) transistor for excellent scalability, and uses a very manufacturable process similar to that of the double-gate or triple-gate transistor. The omega-FET has a top gate adjacent surface 124, two sidewall gates adjacent surfaces 114, and special gate extensions or encroachments 130 under the fin-like semiconductor body.

Figure 3B:
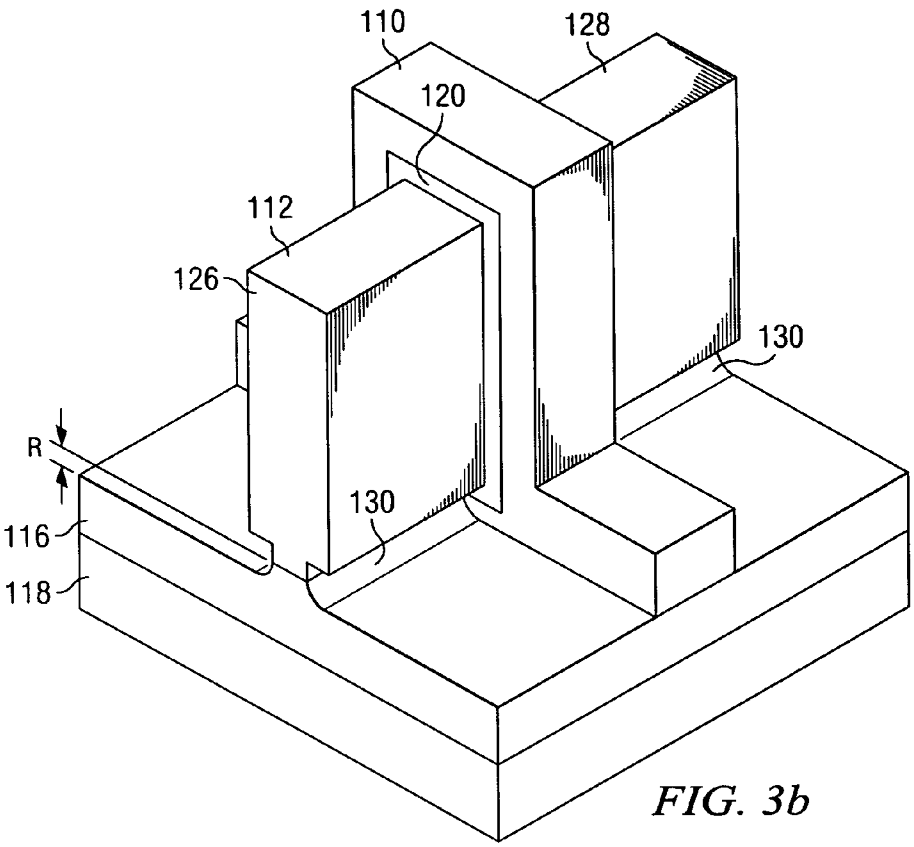
FIG. 3*b* illustrates a three-dimensional perspective of the omega FET.

The omega-FET is therefore a field effect transistor with a gate 110 that almost wraps around the body 112. In fact, the longer the gate extension 130, i.e., the greater the extent of the encroachment E, the more the structure approaches or resembles the gate-all-around structure. A three-dimensional perspective of the triple-gate transistor with recessed insulator, or omega-FET, is schematically illustrated in FIG. 3*b*. The encroachment of the gate electrode 110 under the silicon body 112 helps to shield the channel from electric field lines from the drain 128 and improves gate-to-channel controllability, thus alleviating the drain-induced barrier lowering effect and improving short-channel performance. An example of an omega field-effect transistor is provided by F. L. Yang, et al., "25 nm CMOS Omega-FET's," International Electron Device Meeting, Dig., Technical Papers, December 2002, which is incorporated herein by reference.

Another multiple-gate device that can utilize aspects of the present invention is the surround-gate of wrap-around gate transistor mentioned above. Examples of these deices are taught in the following references, each of which is incorporated herein by reference: J. P. Colinge, et al., silicon-on-insulator gate-all-around device," International Electron Device Meeting, Dig. Technical Papers, pp. 595-598, December 1990; U.S. Pat. No. 6,391,782, B. Yu, Advanced Micro Devices, Inc., May 21, 2002, "Process for forming multiple active lines and gate-all-around MOSFET; E. Leobandung, et al., "Wire-Channel and wrap-around-gate metal-oxide-semiconductor field-effect transistors with a significant reduction of short channel effects," J. Vacuum Science and Technology B, vol. 15, no. 6, pp. 2791-2794, 1997; and U.S. Pat. No. 6,451,656, B. Yu, et al., Advanced Micro Devices, Inc., Sep. 17, 2002, "CMOS inveter configured from double gate MOSFET and method of fabricating same."

Figure 4A:
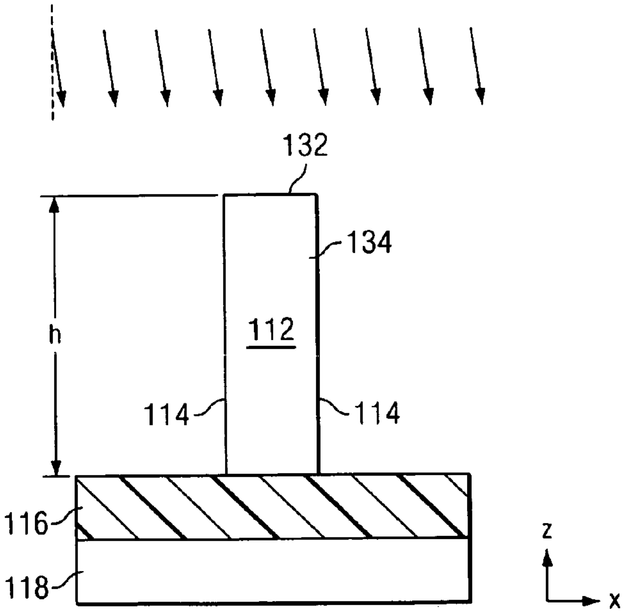
FIG. 4*a* is a cross-sectional view taken along B-B' of FIG. 2.

The multiple-gate transistor structures described, i.e., the double-gate transistor 100, the triple-gate transistor 102, and the omega-FET 104, have a common feature: the fin-like semiconductor active region 112. In doping the source and drain regions 126 and 128 of the semiconductor fin, prior art uses a conventional source and drain ion implantation process where ions are implanted at a small angle with respect to the normal of the wafer or the substrate. In conventional source and drain implantation, a small angle of 7 degrees or less is frequently used, as shown in FIG. 4*a*, which is taken along the B-B' line of FIG. 2.

Using such an ion implantation condition results in most of the implanted dopants reaching the top surface 124 of the fin 112, giving a high-doped top surface region 132. Few dopants are effectively implanted into the sidewall surface 114, resulting in a lightly doped sidewall surface region 134. A long implantation time may be needed to introduce a significant amount of doping in the sidewall source/drain regions 126/128. In addition, since less dopants reach the bottom portion of the fin, the source and drain doping at the bottom portion of the fin will be lower, and may result in a larger channel length at the bottom portion of the fin than at the top portion of the fin.

Figure 4B:
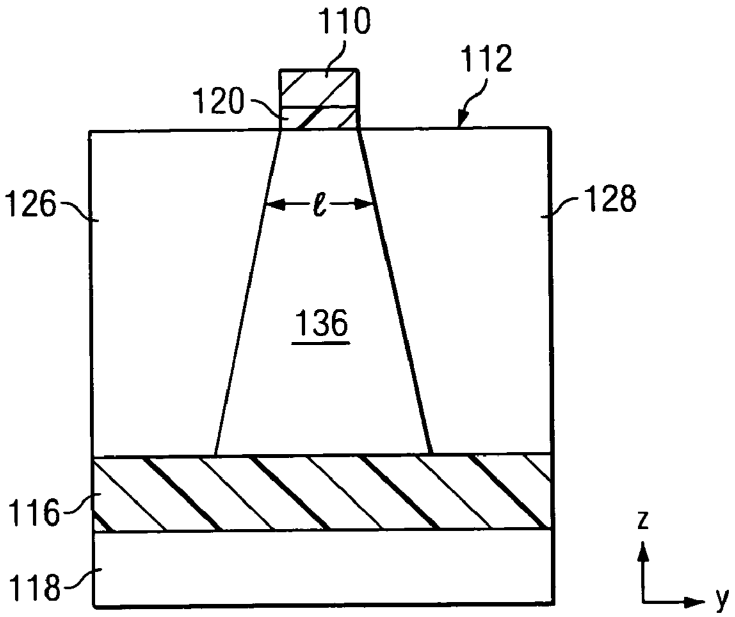
FIG. 4*b* is a cross-sectional view taken along C-C' of FIG. 2.

FIG. 4*b* shows a cross-section of FIG. 2 taken along the C-C' line. A variation of the channel length of channel 136 within the fin 112, i.e., a larger channel length at the bottom portion of the fin, results in a non-uniform source-to-drain current distribution with reduced current at the bottom portion of the fin. Therefore, the performance of the semiconductor fin device is not optimized when the conventional source and drain doping process is used.

Embodiments of the present invention can be implemented using any of a number of multiple gate transistors. Three examples of these transistors are described with respect to FIGS. 1-4. Any of these structures, as well as other structures, can utilize concepts of the present invention. As illustrated in a cross-sectional view in FIG. 1*a*, a double-gate transistor 100 has a gate electrode 110 that straddles across the channel or the fin-like silicon body 112, thus forming a double-gate structure. There are two gates, one on each sidewall 114 of the silicon fin 112, as shown in FIG. 1*a*. The plan view of the double-gate structure is shown in FIG. 2, where FIGS. 1*a* (and 1*b* and 1*c*) are taken along the A-A' line of FIG. 2. The silicon fin 112 is formed on an insulator 116 which is formed on silicon substrate 118. The silicon body 112 is separated from the gate electrode 110 by a gate dielectric 120 along the sidewalls 114 and by a mask 122 along a top surface of the fin 114.

Examples of double-gate transistors are provided in the following references, each of which is incorporated herein by reference. As will become clear from the teachings below, the structures disclosed in these references can be modified and/or utilize the methods of the present invention.

X. Huang, et al., "Sub-50 nm p-channel finFET," IEEE Trans. Electron Devices, vol. 48, no. 5, pp. 880-886, May 2001.

C. Hu et al., U.S. Pat. No. 6,413,802, "FinFET transistor structures having a double gate channel extending vertically from a substrate and methods of manufacture," Jul. 2, 2002.

F. L. Yang, et al., "35 nm CMOS FinFETs," Symposium on VLSI Technology, Digest of Technical Papers, pp. 109-110, June 2002.

H. S. P. Wong, "Beyond the conventional transistor," IBM J. Research and Development, vol. 46, no. 2/3, pp. 133-168, March/May 2002.

F. L. Yang et al., U.S. Pat. No. 6,252,284, "Planarized Si fin device," Jun. 26, 2001.

B. Yu, U.S. Pat. No. 6,391,695, "Double-gate transistor formed in a thermal process," May 21, 2002.

Multiple-gate transistors such as the double-gate transistor, the triple-gate transistor, the omega-FET, have a common feature: the semiconductor fin-like active region. Therefore, such devices are also known as semiconductor fin devices. The semiconductor fin has a predetermined fin height h and a predetermined fin width w. Another common feature of multiple-gate transistors is that the sidewall surfaces of the semiconductor fins are used for current conduction, i.e., a significant amount of source-to-drain current in the multiple-gate transistor is carried along the sidewall surfaces.

Essentially, the effective device width of the multiple-gate transistor is a function of the fin height h (see FIG. 1*a*). In the double-gate transistor, the device width is twice the fin height, i.e., 2 h. In the triple-gate transistor, the device width is given by (2 h+w) (see FIGS. 1*a* and 1*b*). As shown in FIGS. 3*a* and 3*b*, portions of the sidewalls of the semiconductor fin 112 are doped for forming the source region 126 and the drain region 128. Therefore, in the fabrication of semiconductor fin devices or multiple-gate transistors, processes involving the doping of the semiconductor fin, and particularly the sidewall surfaces of the semiconductor fin, are used. Effective and efficient doping of the sidewall surfaces of the semiconductor fin can be used to optimize the transistor characteristics. In one aspect, this invention provides improved methods of doping the semiconductor fin sidewalls in a manufacturing process.

Figure 5A:
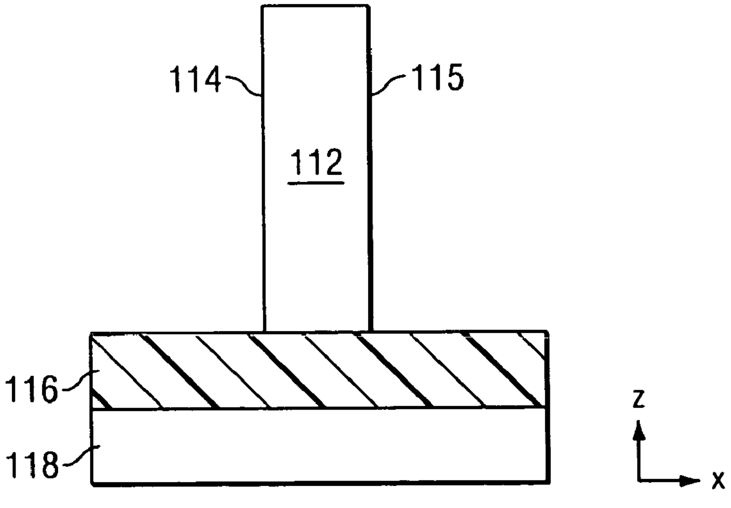
FIGS. 5*a*, 5*b* and 5*c* are cross-sectional views showing doping of a semiconductor fin using a large angle implant.
Figure 5B:
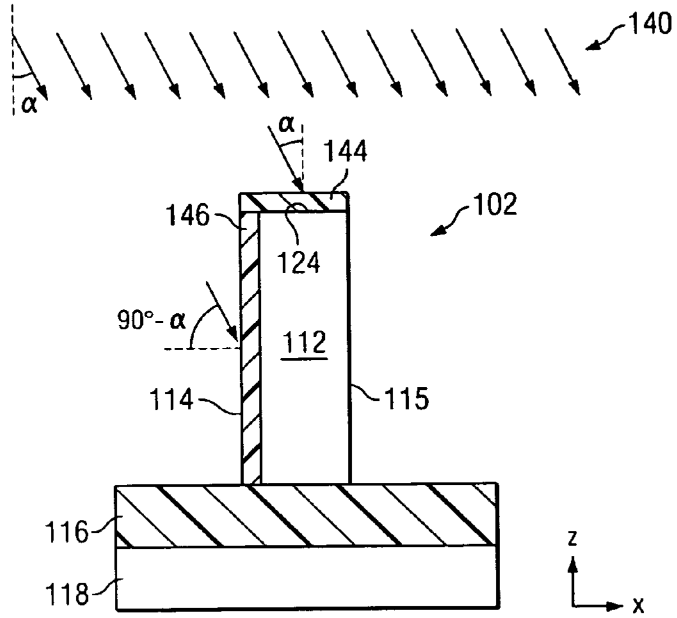
Figure 5C:
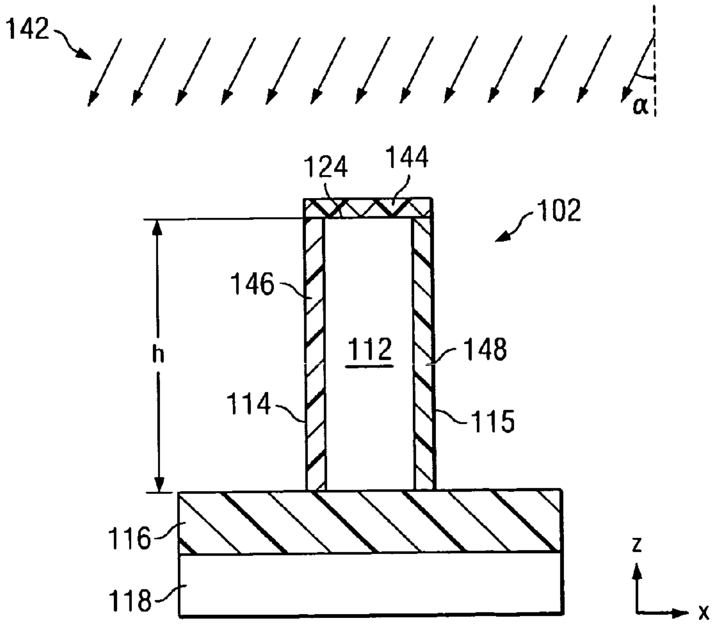

According to this aspect of the invention, the implant angle α for the source and drain doping of the semiconductor fin device is large to optimize the device performance. Referring now to FIGS. 5*a*-5*c*, an ion implantation scheme is shown where the ion implantation is performed in at least two implant steps. As shown in FIG. 5*a*, a semiconductor fin 112 is provided on an insulator layer 116. The insulator layer 116 may have a recess as in the case of an omega-FET as shown in FIG. 1*c*. The thickness of the insulator layer may range from about 100 angstroms to about 2000 angstroms. For illustration purposes, we consider the semiconductor fin 112 for a triple-gate transistor 102.

In the preferred embodiment, the semiconductor fin 112 is formed from silicon, and the implanted ions are p-type dopant ions such as boron and/or indium or n-type dopant ions such as phosphorus, arsenic, and/or antimony. In the first implant step, as shown in FIG. 5*b*, an angled implant (denoted by arrows 140) with an angle α with respect to the normal of the wafer top surface 124 in the z-x plane is performed. The implanted dose is about half the total dose I (in units of dopants per unit wafer surface area) of dopants for the source 126 and drain 128 ion implantation. The total dose I for the source and drain ion implant is typically in the range of about $1\times10^{13}$ to about $1\times10^{16}$ dopants per square centimeter. The first implantation step 140 creates doped top region 144 and doped sidewall region 146.

At the point of incidence at the top fin surface 124, the ions approach the top surface 124 at an angle α with respect to the normal of the top fin surface. The normal of the top fin surface is typically parallel to the normal of the wafer. At the point of incidence to the fin sidewall surface 114, the ions approach the sidewall surface 114 at an angle of (90-α) degrees with respect to the normal of the fin sidewall surface. The angles of α and (90-α) are measured in the plane perpendicular to the plane of the sidewall surface 114.

In the first implant step, the fin's first sidewall surface 114 received a dose of about (I/2).sin(α), the fin's top surface 124 received a dose of about (I/2).cos(α), and the fin's second sidewall surface 115 received essentially no dopants.

In the second implant step, the device 102 is rotated 180 degrees about its normal and the second half dose is implanted at an angle α with respect to the normal of the wafer in the z-x plane, as shown in FIG. 5*c*. In the second implant step (denoted by arrows 142), the fin's second sidewall surface 115 received a dose of about (I/2).sin(α), the fin's top surface 124 received another dose of about (I/2).cos(α), and fin's first sidewall surface 114 received essentially no dopants. As a result, after the first and the second implant steps, the total dose received by the top surface of the fin is I.cos(α), and the total dose received by each sidewall surface is (I/2).sin(α). FIG. 5*c* illustrates the formation of doped sidewall region 148.

In the embodiment illustrated in FIGS. 5*b* and 5*c*, both ion implantation steps 140 and 142 were performed at an angle α. It is noted that the angle of the first implantation step need not be equal to the angle of the second implantation step. It is desirable, (but not necessary) that these angles be close in value so as to maintain consistent operating characteristics in sidewall doped regions 146 and 148.

Figure 6A:
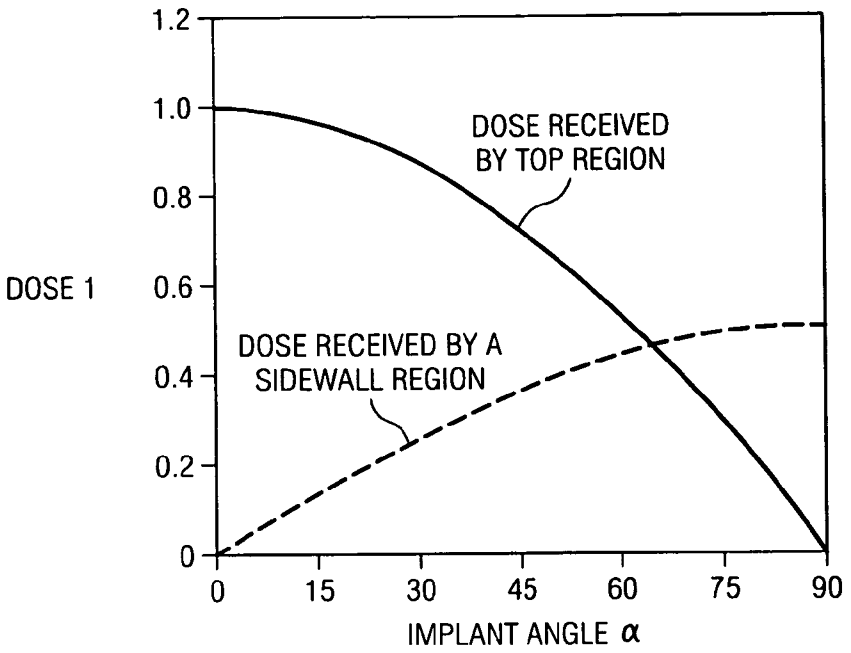
FIG. 6*a* illustrates the doses received in the top and sidewall surface regions of the semiconductor fin as a function of the implant angle.

In FIG. 6*a*, the dose of dopants per unit surface area received in a top surface region 144 and in a sidewall surface region 146 (or 148) of the fin 112 are plotted as a function of the implant angle α. If the angle α is zero, (I/2).sin(α) becomes zero, i.e., no dopants will reach the fin sidewall surface, while I.cos(α) becomes I, i.e., the top surface of the fin will be doped with a dose I. Consequently, if a zero implant angle is used, the source and drain regions 126 and 128 on the fin sidewalls 114 and 115 of the multiple-gate transistor cannot be effectively formed. It is seen that in conventional source and drain ion implant conditions using small angles such as 7 degrees, the dose per unit surface area received by each sidewall surface is less than a tenth of the dose per unit surface area received by the top surface. In this case, a very high implant dose and long implantation time are required for the fin sidewall surface to receive a substantial amount of doping.

The preferred embodiment of this invention teaches that the implant angle should be large for the sidewall surfaces 114 and 115 to receive a substantial amount of doping. In fact, the implant angle is as large as 60 degrees for the top and sidewall surfaces of the fin 112 to have comparable doses, resulting in comparable doping concentrations.

Figure 6B:
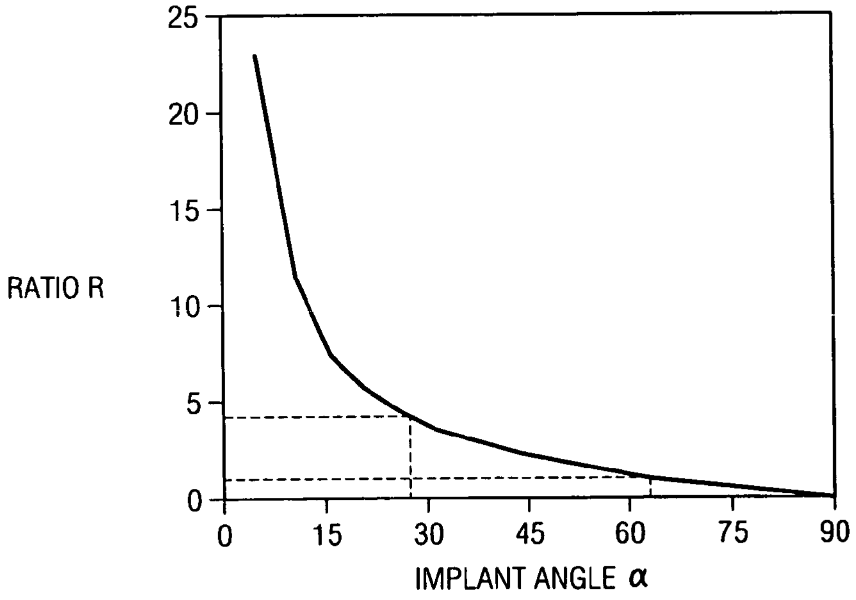
FIG. 6*b* illustrates the ratio of the dose in the top region to the dose in a sidewall surface region as a function of the implant angle.

Referring now to FIG. 6*b*, the ratio of the dose received on the top fin surface 124 to the dose received on a fin sidewall surface 114 (or 115) is plotted as a function of the implant angle α. This ratio can also be interpreted as the ratio of the doping concentration in the top fin surface region 144 to the doping concentration in a fin sidewall surface region 146 (or 148). In one embodiment of the present invention, the ratio is preferably less than about 8, and the corresponding implant angle therefore is more than about 15 degrees. In the preferred embodiment, the ratio is in the range of about 1 to about 4, and the corresponding implant angle has to be in the range of about 26 degrees to about 63 degrees. The doping concentrations in the top surface region 144 and the sidewall surface regions 146 and 148 are preferably more than about $1\times10^{20}$ dopants per cubic centimeter.

According to the teaching of this invention, a large implant angle α has a number of advantages. First, a large angle implant can introduce more dopants more efficiently in the source and drain regions 126 and 128 on the sidewall surfaces of the transistor. As a result, the use of a small angle implant with long implantation time can be avoided. Second, a large angle implant will dope the top surfaces 124 and the sidewall surfaces 114 and 115 of the source and drain regions in the fin more equally. As a result, the channel length of the multiple-gate transistor is maintained the same whether at the top portion of the fin or at the bottom portion of the fin.

Figure 7A:
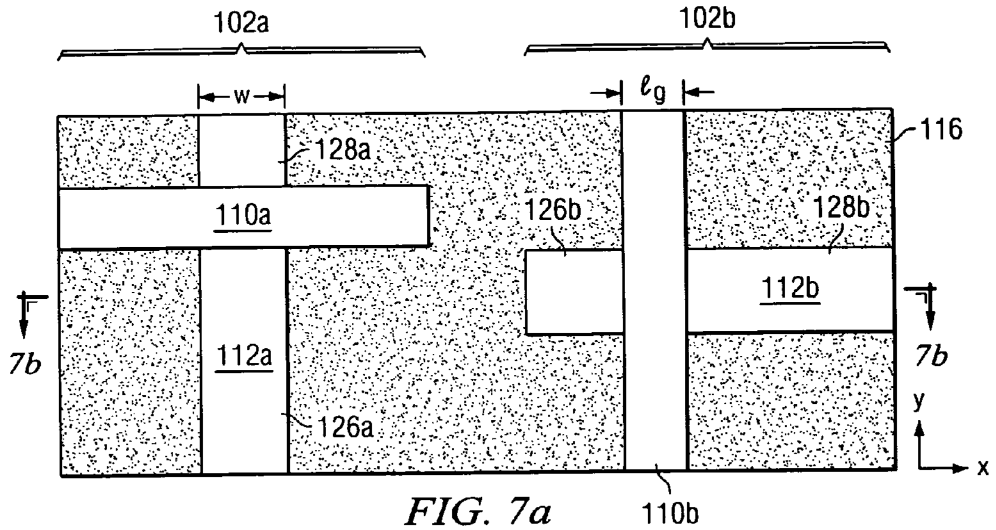
FIG. 7*a* is a plan view of the semiconductor fin device of the present invention.

However, potential problems arise in the use of large angle implants, and solutions to these problems will be provided according to aspects of the present invention. Referring now to FIG. 7*a*, a plan view of two multiple-gate transistors 102*a* and 102*b* are shown, where the two transistors 102*a* and 102*b* have source-to-drain directions that are perpendicular to each other, i.e., the semiconductor fins 112 are oriented in directions that are perpendicular to each other. In other words, the orientations of the semiconductor fins are orthogonal to each other. In FIG. 7*a*, the source-to-drain direction of the first transistor 102*a* is in the y-direction, and the source-to-drain direction of the second transistor 102*b* is in the x-direction. The x-y axes are shown in the bottom right corner of FIG. 7*a*.

The orientations of the gate electrodes 10*a* and 10*b* of the two transistors are also perpendicular to each other. It is understood that the two transistors may be in close proximity to each other, as illustrated in FIG. 7*a*, or may be far apart from each other, such as being located at extreme ends of an integrated circuit die. The multiple-gate transistors shown in FIG. 7*a* may be double-gate transistors, triple-gate transistors, or omega-FETs. For illustration purposes, the multiple-gate transistors are triple-gate transistors.

Figure 7B:
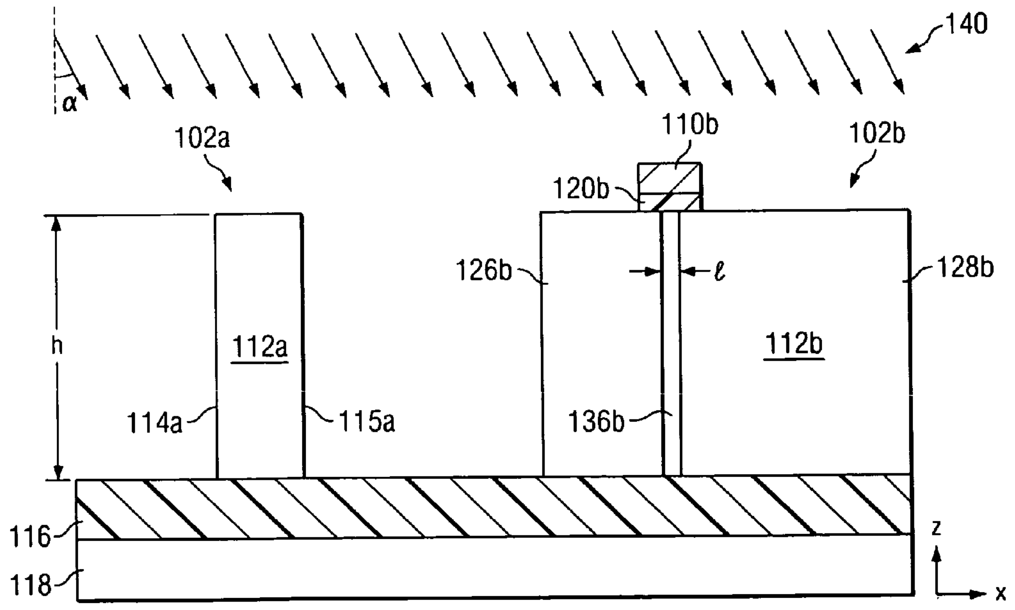
FIG. 7*b* is a cross-sectional view of the semiconductor fin device of the present invention.

FIG. 7*b* shows the cross-sectional view of the triple-gate transistors 102*a* and 102*b* along line 7*b* of FIG. 7*a*. Line 7*b* of FIG. 7*a* cuts through the source region 126*a* of the first transistor 102*a* and the source region 126*b*, channel region 136*b*, and drain region 128*b* of the second transistor 102*b*. In general, in the fabrication process of multiple-gate transistors, semiconductor fins 112 are provided on an insulator layer 116, a gate dielectric layer 120 is deposited, followed by the formation of gate electrodes 110.

The gate dielectric layer may be comprised of silicon oxide or silicon oxynitride. The gate dielectric layer may also comprise high permittivity dielectrics such as lanthalum oxide ($La_2O_3$), aluminum oxide ($Al_2O_3$), hafnium oxide ($HfO_2$), hafnium oxynitride (HfON), zirconium oxide ($ZrO_2$), or combinations thereof. High permittivity dielectrics typically have a relative permittivity of greater than 5. The gate electrode may be comprised of a conductive material. Examples of conductive materials are doped poly-crystalline silicon, doped poly-crystalline silicon-germanium, a metal, or a metal silicide. At this point, before the formation of the source and drain regions 126 and 128, the channel region 136 in the semiconductor fin 112 may be undoped or doped.

The subsequent fabrication process step may involve the formation of the source region 126 and drain region 128 by doping appropriate portions of the semiconductor fin 112. If a large angle implant with an angle α in the z-x plane is used to dope the first sidewall 114*a* of the semiconductor fin of the first transistor 102*a*, the channel region 136*b* of the second transistor 102*b* will also receive the source and drain dopants, causing degradation to the performance of the second transistor 102*b*. The same problem occurs when using a large angle implant to dope the second sidewall 115*a* of the first transistor 102*a*.

In general, the large angle implant steps, while providing efficient doping of the source and drain regions of transistors with a first source-to-drain orientation, e.g., source-to-drain direction in y-direction, will also dope the channel region of the transistors with a second perpendicular source-to-drain orientation, e.g., source-to-drain direction in x-direction, with the same source/drain dopants. This is because a source and drain implant 140 with a large implant angle α such as 30 degrees has an implant angle similar to that of a halo implant and can therefore dope the channel region 136*b* of the second transistor. Standard conventional halo implants, however, dope the channel region 136 with dopants of the opposite type to the source 126 and drain 128 dopants in order to control short channel effects. When the channel region 136*b* of the second transistor 102*b* is doped with the dopants intended for the source and drain regions 126*a* and 128*a*, the second transistor 102*b* will have degraded short-channel behavior and may even fail due to an electrical short between the source and drain 126*b* and 128*b*.

Figure 8A:
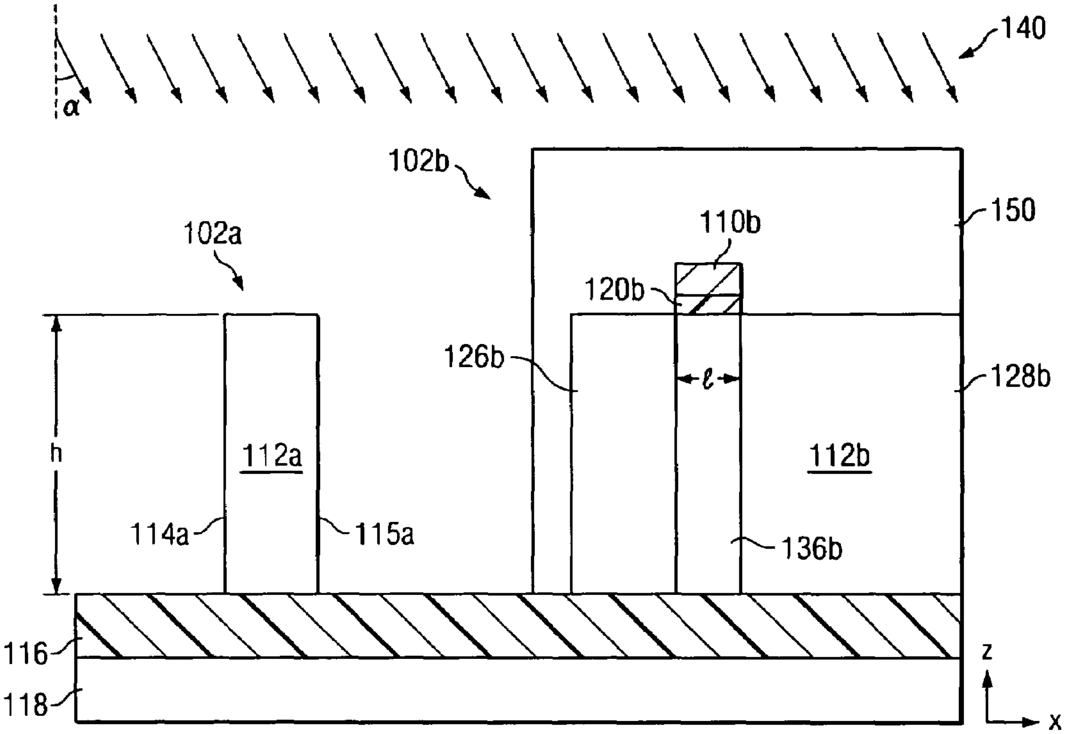
FIG. 8*a* illustrates the second transistor masked during the doping of the source and drain regions of the first transistor.

According to aspects of this invention, a method is provided in which a large angle implant may be used to dope the source and drain regions 126*a* and 128*a* of the first transistor 102*a* with a first source-to-drain orientation without doping the channel region 136*b* of the second transistor 102*b* with a second perpendicular source-to-drain orientation. Prior to the source and drain implant, a mask material 150 is deposited on the wafer to cover both the first and second transistors 102*a* and 102*b*. The mask material is patterned, e.g., by optical lithography, and the portion of the mask material 150 that covers the first transistor 102*a* is removed to form a first mask 150, as shown in FIG. 8*a*. The first mask 150 covers the second transistor 102*b*, shielding the channel region 136*b*, during the doping of the source and drain regions 126*a* and 128*a* of the first transistor 102*a*.

The doping of the source and drain regions 126*a* and 128*a* may be performed in two implant steps, as described above, in which a half-dose angled implant is performed to dope the first sidewall 114*a* and top surface 124*a* of the fin 112*a* of the first transistor 102*a* followed by another half-dose angled implant to dope the second sidewall 115*a* and top surfaces 124*a*. Following the doping of the source and drain regions 126*a* and 128*a*, the first mask 150 may be removed.

Figure 8B:
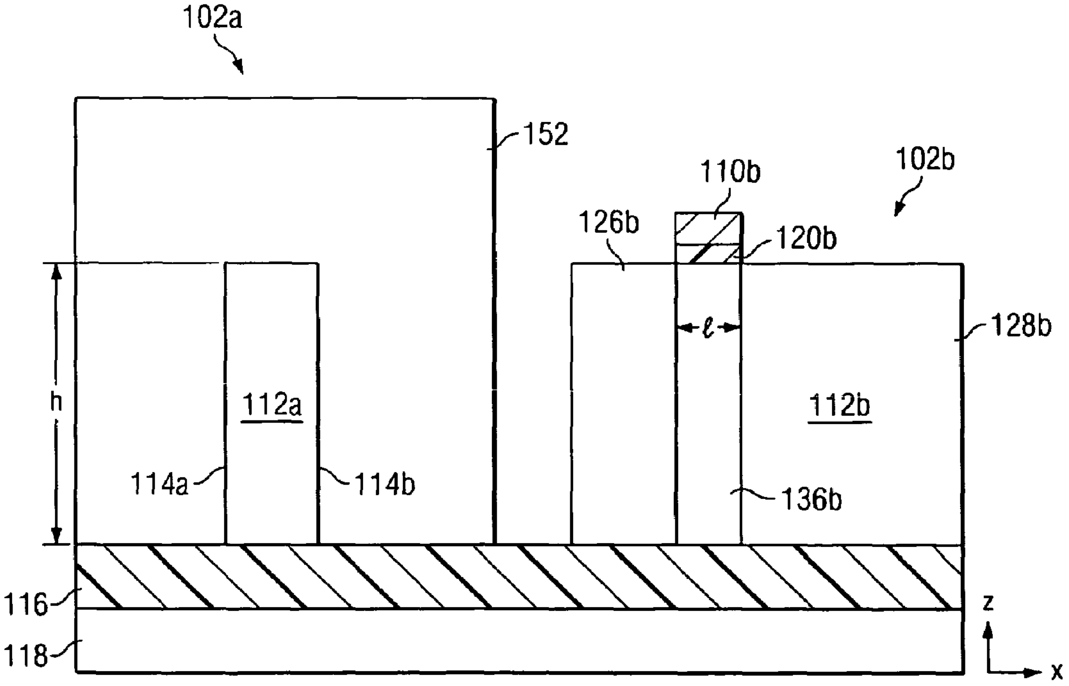
FIG. 8*b* illustrates the first transistor masked during the doping of the source and drain regions of the second transistor.

Next, a second mask 152 is formed to expose the second transistor 102*b* while covering the first transistor 102*a*. An ion implantation including at least two steps is performed to dope the source and drain regions 126*a* and 128*a* of the second transistor 102*b*. The channel region 136*a* of the first transistor 102*a* is shielded from this ion implantation process by the second mask 152. The implant angle of the ion implantation process to dope the source and drain regions 126*b* and 128*b* of the second transistor 102*b* is oriented at an angle β in the z-y plane. The angle β is in the z-y plane which is perpendicular to the plane of the sidewall 114*b* of the semiconductor fin 112*b* of the second transistor. In FIG. 8*b*, the positive y-axis is into the plane of the paper while the negative y-axis is out of the plane of the paper (and, as a result, the angle β cannot be explicitly drawn).

The second mask 152 may then be removed. A high temperature annealing step may be performed to activate the implanted dopants in the semiconductor fins 112*a* and 112*b*. The annealing step may be a spike anneal process in which the wafer temperature is rapidly increased to a peak temperature of 1050 degrees Celsius followed by a rapid cooling of the wafer temperature, or any other annealing techniques such as a rapid thermal anneal (RTA) commonly known and used in the art.

In the above-mentioned method embodiment, it is seen that the doping of source and drain regions 126 and 128 in transistors of the same type, e.g., n-type or n-channel, involves an additional mask patterning step. The introduction of an additional mask is sometimes costly and could be commercially prohibitive. Therefore, a further improvement over the above-mentioned embodiment is to align all multiple-gate transistors of the same type with a predetermined range of gate lengths in the same direction to permit the use of a large angle implant without the introduction of an additional mask. This is described in another embodiment of the present invention.

According to this embodiment, all multiple-gate transistors of the same conductivity type and with gate lengths less than or equal to a predetermined gate length are oriented in the same direction. In this context, all of transistors refers to all of the functional or operational transistors that are designed to operate with optimum characteristics. For example, this does not include dummy transistors or other transistors that do not operate in the circuits of the chip. The predetermined gate length is determined based on susceptibility to short-channel effects. Transistors with shorter gate lengths are more susceptible to short-channel effects. The predetermined gate length may be 30 nm, for example. In another example, the predetermined gate length may be the minimum gate length.

Figure 9:
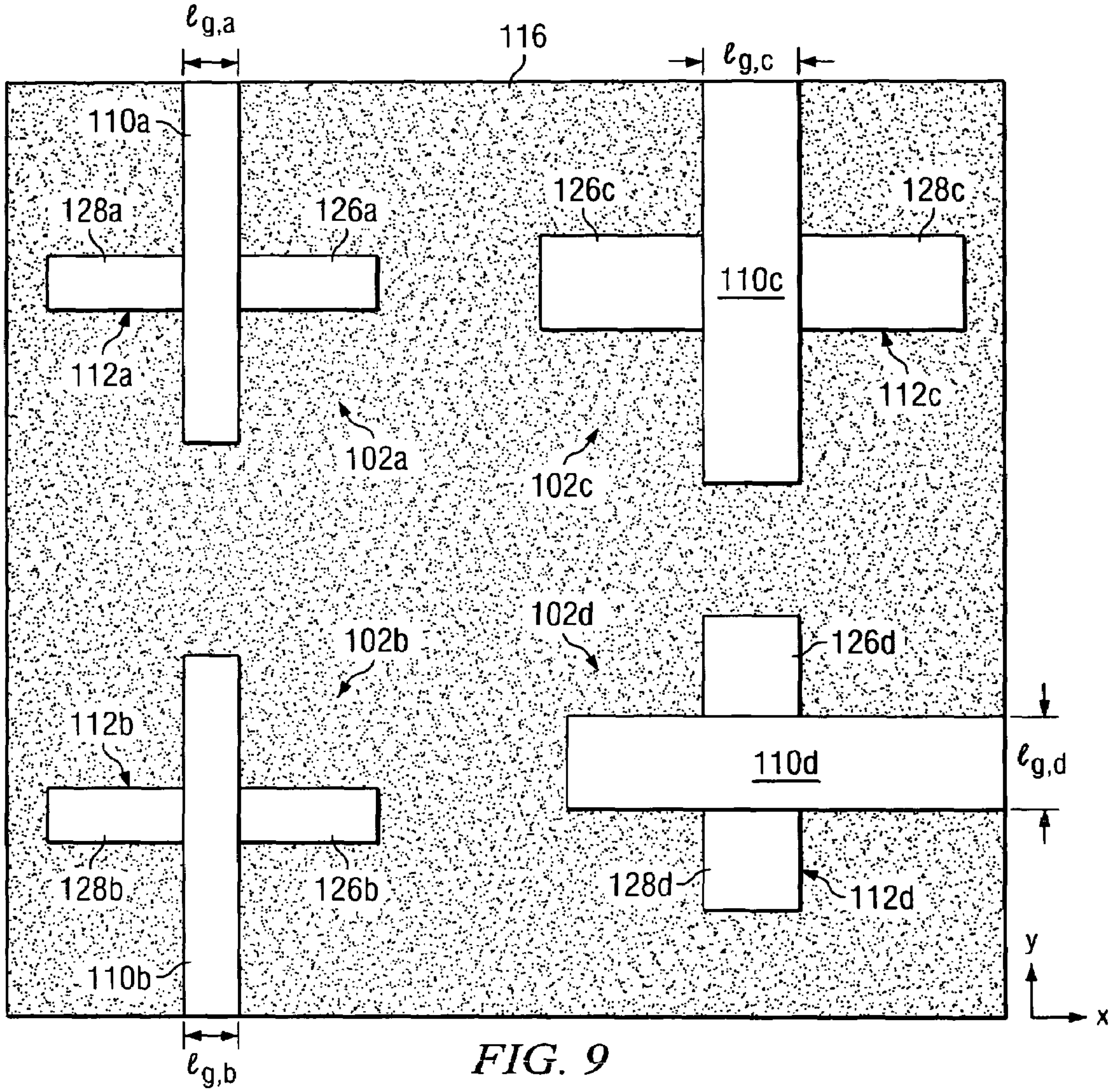
FIG. 9 illustrates an n-type transistor of the present invention.

Since the large angle implant for doping the source and drain regions 126 and 128 of transistors of a first source-to-drain orientation degrade short-channel effects of transistors with other source-to-drain orientations, transistors susceptible to degradation of short-channel effects should all have the same source-to-drain direction. This means, for example, that all n-type multiple-gate transistors with gate lengths less than 30 nm have the source-to-drain direction oriented in the x-direction. This is illustrated in FIG. 9 where gate lengths $L_{g,a}$ and $L_{g,b}$ are less than the predetermined gate length, e.g., 30 nm, while $L_{g,c}$ and $L_{g,d}$ are larger than the predetermined gate length. Transistor 102*a* comprising a gate electrode 110*a*, source and drain regions 126*a* and 128*a*, and transistor 102*b* comprising a gate electrode 110*b*, source and drain regions 126*b* and 128*b*, of FIG. 9, having gate lengths of $L_{g,a}$ and $L_{g,b}$ respectively, therefore have substantially the same source-to-drain orientations (i.e., the source-to-drain current paths are substantially parallel). Transistor 102*c* comprising a gate electrode 110*c*, source and drain regions 126*c* and 128*c*, and transistor102*d* comprising a gate electrode 110*d*, source and drain regions 126*d* and 128*d*, have gate lengths of $L_{g,c}$ and $L_{g,d}$, respectively, and they may have any source-to-drain orientations.

It is understood, however, that transistor 102*c* and transistor 102*d* may have different electrical characteristics or vulnerability to short-channel effects depending on the ion implantation conditions used to dope their source and drain regions 126 and 128. The x-direction can be, for example, a crystallographic direction such as the [100] direction. In this case, the sidewall surfaces of the n-channel multiple-gate transistor are (100) surfaces. N-channel multiple-gate transistors with (100) sidewall surfaces are expected to have the best electron mobility. In another example, all p-type multiple-gate transistors with gate lengths less than 30 nm may have the source-to-drain direction oriented in the [110] crystallographic direction. In this case, the sidewall surfaces of the p-channel multiple-gate transistor are (110) surfaces. P-channel multiple-gate transistors with (110) sidewall surfaces is expected to have the best hole mobility.

In another method embodiment, the semiconductor fins 112 may be doped by solid-source diffusion instead of ion implantation as described in the other method embodiments. In the solid-source diffusion technique, a dopant-containing material (the solid source) is deposited on the semiconductor fin to be doped. An elevated temperature treatment is then performed to allow the dopants in the dopant-containing material or solid-source to diffuse into the semiconductor fins. Examples of dopant-containing materials include boro-silicate glass (BSG), phospho-silicate glass (PSG), doped germanium, etc. The discussion related to FIG. 9 also applies to this embodiment.

While several embodiments of the invention, together with modifications thereof, have been described in detail herein and illustrated in the accompanying drawings, it will be evident that various modifications are possible without departing from the scope of the present invention. The examples given are intended to be illustrative rather than exclusive. The drawings may not necessarily be to scale and features may be shown in a schematic form.

What is claimed is:

1. A semiconductor-on-insulator chip comprising:

multiple-gate transistors formed on an insulator layer, each multiple gate transistor comprising:

a semiconductor fin having an orientation in a first direction, a gate electrode formed adjacent a channel region portion of the semiconductor fin, the gate electrode having a gate length of less than about 30 nm, and a source region and a drain region disposed within the semiconductor fin such that the channel region portion is disposed between the source region and the drain region, wherein the channel region portion is doped to a first conductivity type and the source and drain regions are doped to a second conductivity type that is different than the first conductivity type;

wherein the multiple gate transistors include all of the multiple-gate transistors on the semiconductor-on-insulator chip that have the gate length of less than about 30 nm and the channel region portion of the first conductivity type; and wherein a ratio of a doping concentration in a top surface region of the semiconductor fin to a doping concentration in a sidewall region of the semiconductor fin is between about 1 and about 4.

2. The chip of claim 1, wherein the semiconductor fin comprises silicon, wherein the at least some of the multiple-gate transistors are p-type transistors, wherein the orientation of the semiconductor fin is in the direction, and wherein the semiconductor fin has sidewall surfaces that are (110) crystallographic surfaces.

3. The chip of claim 1, wherein the semiconductor fin comprises silicon, wherein the at least some of the multiple-gate transistors are n-type transistors, wherein the first orientation is in the direction, and wherein the semiconductor fin has sidewall surfaces that are (100) crystallographic surfaces.

4. The chip of claim 1, wherein an etchant mask overlies each semiconductor fin.

5. The chip of claim 1, wherein the insulator layer is recessed, resulting in a notch at the base of each semiconductor fin.

6. The chip of claim 1, wherein a first sidewall region of the semiconductor fin and a second sidewall region of the semiconductor fin are doped to a doping concentration greater than about $1\times10^{20}$ $cm^{-3}$.

7. The chip of claim 1, wherein the insulator layer has a thickness of between about 100 angstroms and about 2000 angstroms.

8. The chip of claim 1, further comprising a gate dielectric layer overlying a portion of the semiconductor fin and underlying the gate electrode, and wherein the gate dielectric layer comprises a high permittivity material.

9. The chip of claim 8, wherein the gate dielectric layer is selected from the group consisting of lanthanum oxide, aluminum oxide, hafnium oxide, hafnium oxynitride, zirconium oxide, and combinations thereof.

10. The chip of claim 8, wherein the gate dielectric layer comprises of high permittivity materials with relative permittivity greater than 5.

11. The chip of claim 1, wherein the gate electrode comprises a metal.

12. The chip of claim 1, wherein the multiple gate transistors include all of the transistors on the semiconductor-on-insulator chip that have the gate length of less than about 30 nm and the channel region portion of the first conductivity type.

13. The chip of claim 1, wherein the gate length is equal to the minimum feature size.

14. A semiconductor device comprising:

first semiconductor fins disposed in a substrate and comprising first channel regions of a first conductivity type;

first gate electrodes formed adjacent the first channel regions of the first semiconductor fins;

first source regions and first drain regions disposed within the first semiconductor fins such that the first channel regions are disposed between the first source regions and the first drain regions, the first source regions and the first drain regions comprising an opposite second conductivity type, wherein the first gate electrodes, the first channel regions, the first source regions, and the first drain regions form first multiple gate transistors of the second conductivity type, wherein all the first multiple-gate transistors of the second conductivity type on the semiconductor device with gate lengths less than about 30 nm are oriented in a first orientation, and wherein a ratio of a doping concentration in a top surface region of the semiconductor fins to a doping concentration in a sidewall region of the semiconductor fins for each of the first source and first drain regions is between about 1 and about 4;

second semiconductor fins disposed in the substrate and comprising second channel regions of the second conductivity type;

second gate electrodes formed adjacent the second channel regions of the second semiconductor fins; and second source regions and second drain regions disposed within the second semiconductor fins such that the second channel regions are disposed between the second source regions and the second drain regions, the second source regions and the second drain regions comprising the first conductivity type, wherein the second gate electrodes, the second channel regions, the second source regions, and the second drain regions form second multiple gate transistors of the first conductivity type, wherein all the second multiple-gate transistors of the first conductivity type on the semiconductor device with gate lengths less than about 30 nm are oriented in a second orientation perpendicular to the first orientation and wherein a ratio of a doping concentration in a top surface region of the semiconductor fins to a doping concentration in a sidewall region of the semiconductor fins for each of the first source and first drain regions is between about 1 and about 4.

15. The device of claim 14, wherein the substrate comprises silicon, wherein the first conductivity is n-type and the second conductivity is p-type, wherein the first orientation is the direction, and wherein the semiconductor fins have sidewall surfaces that are (110) crystallographic surfaces.

16. The device of claim 14, wherein the substrate comprises silicon, wherein the first conductivity is p-type and the second conductivity is n-type, wherein the first orientation is the direction, and wherein the semiconductor fins have sidewall surfaces that are (100) crystallographic surfaces.

17. The device of claim 14, wherein the substrate comprises a silicon-on-insulator substrate, wherein the multiple gate transistors are disposed on an insulator layer.

18. The device of claim 14, further comprising gate dielectric layers disposed between the channel regions and the gate electrodes, wherein the gate dielectric layers comprise a high permittivity material, and wherein the gate electrodes comprise a metal.

19. The device of claim 14, wherein all transistors on the semiconductor device of the second conductivity type with gate lengths less than about 30 nm are oriented in a first orientation.

* * * * *

UNITED STATES PATENT AND TRADEMARK OFFICE

CERTIFICATE OF CORRECTION

PATENT NO. : 7,701,008 B2
APPLICATION NO. : 11/446890
DATED : April 20, 2010
INVENTOR(S) : Yeo et al.

It is certified that error appears in the above-identified patent and that said Letters Patent is hereby corrected as shown below:

In Col. 10, line 60, claim 2, before direction insert --[110]--.
In Col. 10, line 66, claim 3, before direction insert --[100]--.
In Col. 12, line 31, claim 15, before direction insert --[110]--.
In Col. 12, line 36, claim 16, before direction insert --[100]--.

Signed and Sealed this

Twenty-ninth Day of June, 2010

David J. Kappos

*Director of the United States Patent and Trademark Office*